United States Patent [19]

Hawkins et al.

[11] Patent Number: 5,096,535
[45] Date of Patent: Mar. 17, 1992

[54] PROCESS FOR MANUFACTURING SEGMENTED CHANNEL STRUCTURES

[75] Inventors: William G. Hawkins, Webster; James F. O'Neill, Penfield; Roberto E. Proano, Rochester, all of N.Y.

[73] Assignee: Xerox Corporation, Stamford, Conn.

[21] Appl. No.: 631,519

[22] Filed: Dec. 21, 1990

[51] Int. Cl.$^5$ .............. H01L 21/306; B44C 1/22; C03C 15/00; C03C 25/06
[52] U.S. Cl. .................. 156/633; 156/647; 156/657; 156/659.1; 156/662; 346/140 R
[58] Field of Search ............. 156/633, 647, 654, 657, 156/659.1, 662; 346/1.1, 75, 140 R; 252/79.5

[56] References Cited

U.S. PATENT DOCUMENTS

| Re. 32,572 | 1/1988 | Hawkins et al. | 156/626 |
|---|---|---|---|
| 4,600,934 | 7/1986 | Aine et al. | 357/26 |
| 4,786,357 | 11/1988 | Campanelli et al. | 156/633 |
| 4,829,324 | 5/1989 | Drake et al. | 346/140 R |
| 4,863,560 | 9/1989 | Hawkins | 156/644 |
| 4,875,968 | 10/1989 | O'Neill et al. | 156/633 |
| 4,899,181 | 2/1990 | Hawkins et al. | 346/140 R |
| 4,915,718 | 4/1990 | Desai | 65/31 |
| 4,957,592 | 9/1990 | O'Neill et al. | 156/644 |

Primary Examiner—William A. Powell
Attorney, Agent, or Firm—Kenyon & Kenyon

[57] ABSTRACT

In semiconductor technologies such as thermal ink jet printhead fabrication, there exists a need for the precise placement of channels in a substrate. Due to errors in plane alignment in semiconductor substrates, channel structures tend to widen dimensions, thus lowering precision. A one-step anisotropic etching process is disclosed for accurately making channel structures, as well as reservoir structures. Channel structures are formed by segmenting the channel, such that during the anisotropic etching, thin walls between the segments break down before the completion of the etch. Widening of channels is greatly reduced, thus increasing precision. During such a one-step process, larger structures, such as a reservoir, can be formed during the same step.

23 Claims, 5 Drawing Sheets

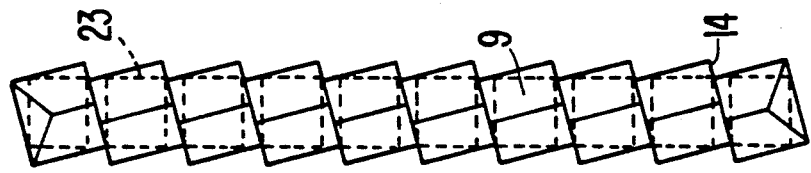
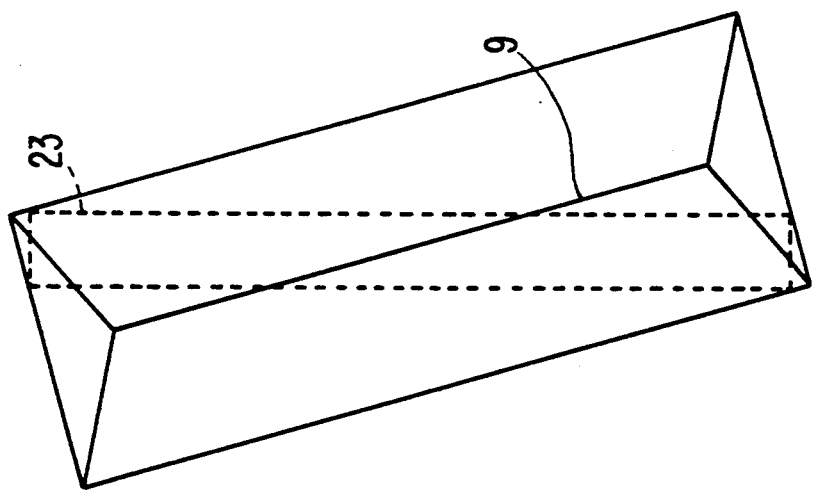

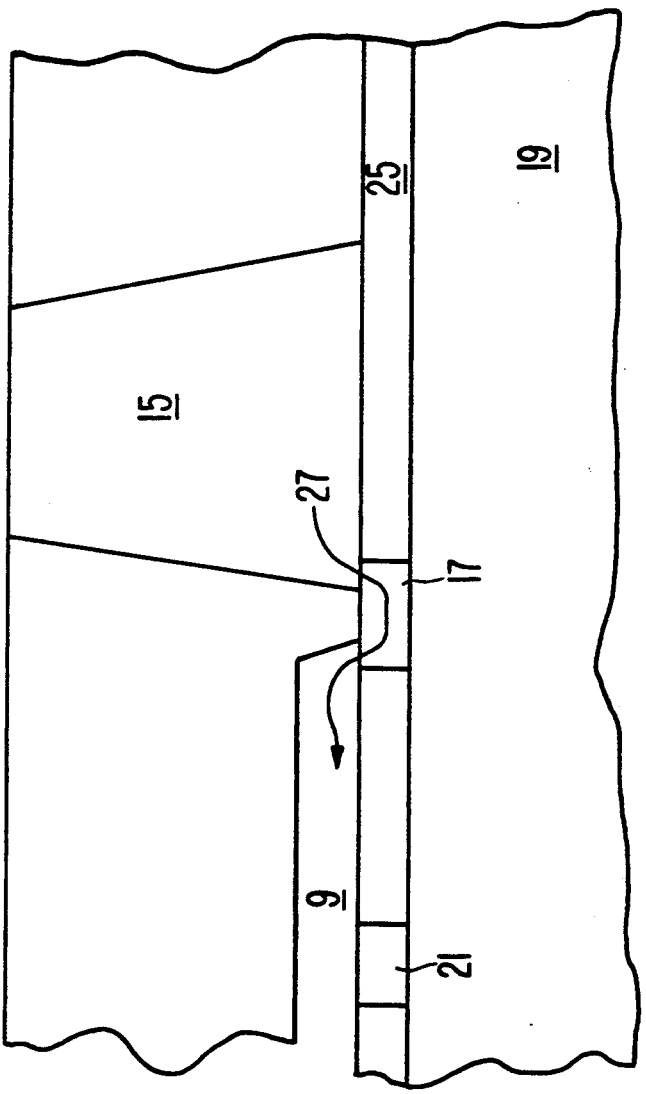

PROCESS FOR MANUFACTURING SEGMENTED CHANNEL STRUCTURES

BACKGROUND OF THE INVENTION

The present invention relates to a process for making channels in a substrate, and, more particularly, to a process for making precisely sized channels by segmenting their walls in such a way that the walls disintegrate during the etching step.

In printer heads, such as thermal ink jet print heads, ink is transferred from an ink reservoir through channels to channel orifices or nozzles. Orientation dependent etching (ODE) or anisotropic etching is used to etch the channels in a substrate such as silicon. There are several processes for producing such channels in silicon.

In an orientation dependent etching process of silicon, features are limited to rectangular structures. Alignment to the <110> direction on the {100} silicon plane is critical to good dimensional control. The loss of dimensional control resulting from misalignment of the mask pattern to the <110> direction of the silicon wafer can be determined from equation 1, below:

$$W_F = W_O \cos \Theta + L_O \sin \Theta$$

where
$W_F$ = Final Width Dimension
$W_O$ = Mask Width Dimension
$L_O$ = Mask Length Dimension
$\Theta$ = Misorientation of the mask to the <110> direction of the silicon wafer.

A stable structure, as defined by the above equation, will be attained if sufficient etch time is allowed.

For an orientation dependent etch process there is also a bath related undercutting dependent on the bath composition and temperature. The etch rate ratio of the {100}:{111} silicon planes will vary depending on composition, concentration and temperature of the etch bath. This etch rate ratio must be known in order to properly design a mask. A typical undercut expected for full through etching of a 500 μm thick (100) surface plance silicon wafer is 5 μm for a 30% KOH—H₂O etch bath at 95° C.

In a one-step etch process, a single photolithographic and anisotropic etch step is used to form channels, reservoir, and dicing relief structures in a (100) surface place silicon wafer. Referring generally to FIG. 1, the channels 1 and reservoir 3 for a one-step process are shown. The advantages of this process is its simplicity and low cost. However, the one-step process requires long etch times, which drive the channel structures to be completely terminated by {111} crystal planes in the substrate. Therefore, the process is sensitive to misorientation between the lithographically defined etch mask (e.g. Si₃N₄) and the <110> crystal direction on the (100) surface plane direction as well as the misorientation of the wafer (100) surface plane. The anisotropic etching process is driven to completion because the etch proceeds horizontally along the channels as well as vertically into the surface. Thus, the time required for a given structure to completely terminate depends on the longest dimension of the channel feature. The one-step process is advantageous if the tolerances of the channel dimensions can be tightly controlled. Using the mask shown in FIG. 1, channel size uniformity is ±1 μm, 3σ.

In a two-step terminated process, two photolithographic etching steps are performed before the orientation dependent etching steps. Referring to FIG. 2, the two-step terminated process is shown generally. In the first etching step, the substrate is exposed to an anisotropic etchant through a mask which is typically made of Si₃N₄ (appears as a solid line in FIG. 2). After the long etch time, structures are etched through the substrate (i.e. fill hole and reservoir 7), the Si₃N₄ mask is chemically stripped, leaving a second etch mask, which is typically SiO₂ (appears as a dashed line in FIG. 2). The SiO₂ etch mask allows separated channels 5 to be anisotropically etched adjacent to the reservoir 7. The depth of the channels 5 are quite small as compared to the thickness of the wafer. For example, the depth of the channels 5 would be on the order of 40 μm while the wafer will have a thickness of 500 μm. Thus, the second etch time is much smaller (approximately 90% smaller) than the first etch. The short second etch is sufficient to allow this anisotropic etch to terminate in a V shape. However, misorientation between the channel pattern and the <110> direction is not completely resolved and a stable structure is not achieved due to the very short etch time. In typical specifications for semiconductor wafers, up to a 1.0° discrepancy in the alignment of the <110> silicon crystal plane and the wafer flat is common. The two-step terminated process enables an inherently tighter channel dimensional control, but has increased process complexity and cost.

In a two-step unterminated process, the channels are connected to the reservoir in the second etching step. To have an appropriate connection, the timing of the second etching step has to be very exact. Also, the etch aspect ratio is unfavorable since lateral etching is faster than depth etching. For example, 6 mils of channel length is lost in etching approximately 1.5 mils deep. The lateral etch rate is also variable which leads to uniformity problems in channel length dimensions.

Examples of methods for etching channels are shown in U.S. Pat. Nos. 4,915,718 and 4,600,934. The '718 patent relates to a two-step etching process where a channel is started in the first etching step with a nozzle area substantially masked. In the second etching step, the masking is removed and the nozzle is etched with the channel forming a shallow connection between the channel and a reservoir.

The '934 patent relates to a method for undercut anisotropic etching of semiconductor material. In this method, etching is performed on the (110) face of the substrate at angles as close to the <111> direction as possible so that oriented side edges will be undercut from the sides.

In the aforementioned methods for fabricating channels and reservoirs in substrates for thermal ink-jet printheads and other devices, errors occur due to pattern misalignment to the <110> direction of the substrate. For instance, a typical channel is 50 μm by 500 μm having its lengthwise axis perpendicular to the <110> direction. If the <110> direction is misoriented by 0.2° with respect to the lengthwise mask channel axis, then the channel will increase in width by 1.57 μm to 51.57 μm, if given sufficient etching time. Such an increase in width does not occur when the <110> direction is perfectly oriented. The standard manufacturing tolerance for the orientation of the <110> direction in a wafer and the substrate flat is ±1.0°, so an error such as this is quite common.

In view of the methods described above, there is a need for an improved method of forming channels in substrates having precise dimensions. There is also a need for a method that is simpler and economically efficient as compared to previous methods.

SUMMARY OF THE INVENTION

The present invention relates to a method of forming channels in substrates. In this method an etching mask film is formed on a planar surface of a substrate. The etching mask film, such as $Si_3N_4$, is then coated with a layer of photoresist. Then, the photoresist layer is exposed to electromagnetic radiation through a mask comprising transparent and opaque areas sufficiently so that areas in the photoresist layer become more soluble to a photoresist developer than others. During this exposing step, a series of channel locations are formed in the photoresist layer as a plurality of adjacent segmented soluble areas rather than one long channel area. The photoresist layer is then developed sufficiently to expose the etching mask film in the segmented areas. The etching mask film is then etched by wet etching, or preferably plasma etching, in those exposed areas sufficiently to expose segmented areas in the substrate. The segmented areas in the etching mask will be separated by a plurality of wall structures. The substrate is then anisotropically etched in the exposed areas of the substrate. Wall structures formed during this anisotropic etching step are substantially removed before the etching step is terminated. This one-step process also allows for the formation of reservoirs at the same time in the substrate. Reservoirs will appear as broad exposed areas (as compared to the narrow channel structure) on the substrate, and will be etched through the substrate during the anisotropic etching step.

The substrate can be formed from silicon, and the method of the present invention can be used on the {100} and {110} wafers. As an example of the present invention, each channel will be made up of a series of adjacent 50 $\mu$m × 50 $\mu$m segments with a separation of 8 $\mu$m to 10 $\mu$m. If the separation is 9 $\mu$m, the wall structures formed between the segments during the anisotropic etching step will self-destruct approximately 90% into the etch for a 5 $\mu$m bath related undercut. The channel structures can be incorporated with a reservoir on a channel plate and coupled with a heater die to form a thermal ink jet printhead. In this way very tight dimensional control can be maintained not only within a wafer but also from batch to batch.

The above is a brief description of some deficiencies in disclosed methods for improving the formation of channels in substrates and advantages of the present invention. Other features, advantages and embodiments of the invention will be apparent to those skilled in the art from the following description, accompanying drawings and appended claims.

BRIEF DESCRIPTION OF THE DRAWINGS

FIGS. 4a and 4b are schematic diagrams comparing a segmented and non-segmented single-step channel plate design after etching is completed; and FIG. 5 is a schematic diagram illustrating a structure for communicating ink between the ink reservoir and the channels.

DETAILED DESCRIPTION

Figure 3:
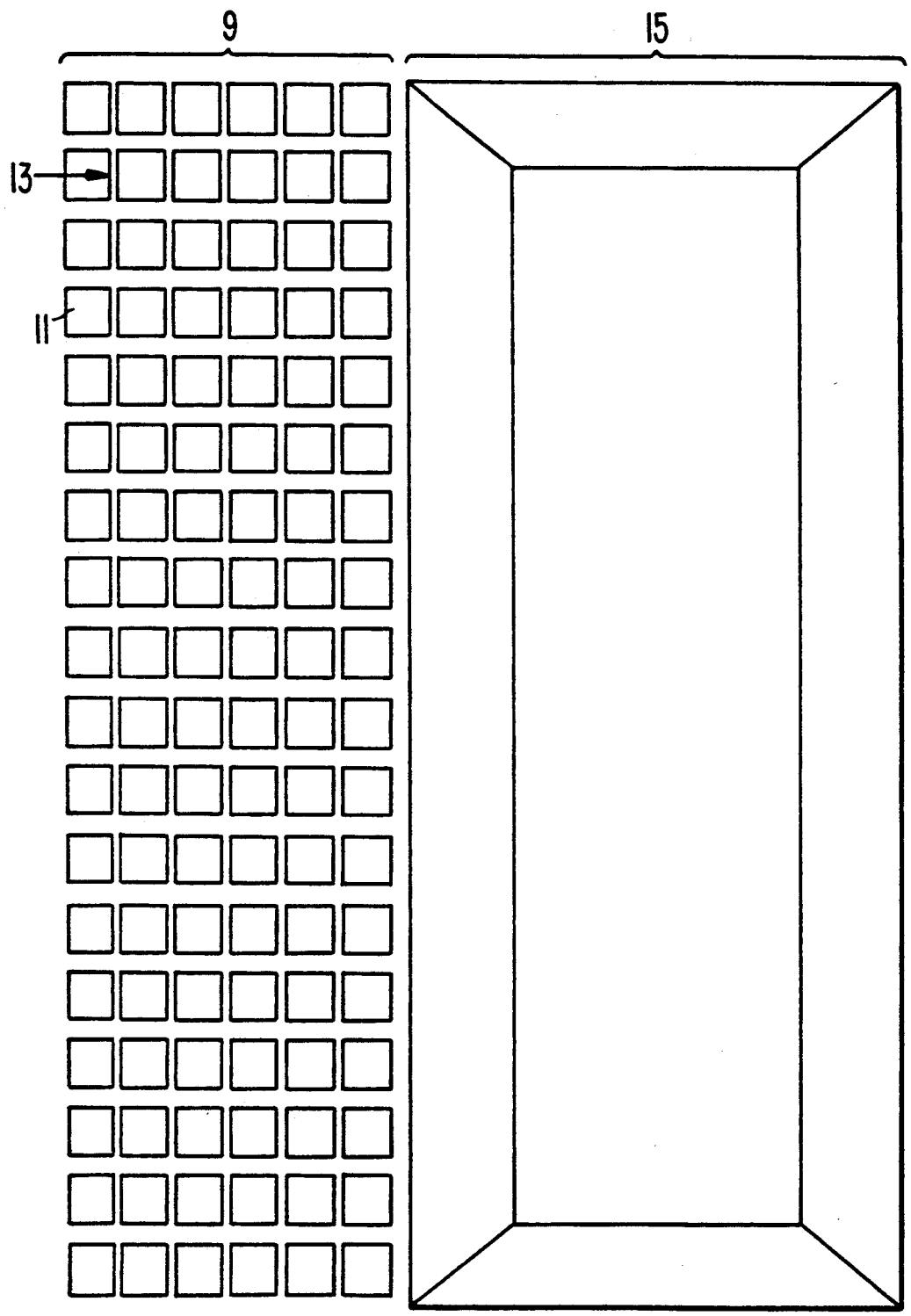
FIG. 3 is a schematic diagram of a segmented single-step channel plate design, constructed according to the present invention.

Orientation dependant etching processes are known generally in, for example, U.S. Pat. Nos. Re. 32,572 to Hawkins et al., 4,863,560 to Hawkins, and 4,899,181 to Hawkins et al., the disclosure of which are incorporated herein by reference in their entirety. Referring to FIG. 3, a segmented single step channel plate design is shown. Each channel 9 comprises a plurality of smaller segments 11. For example, if a series of channels is desired having a width of 50 $\mu$m and a length of 500 $\mu$m, each channel 9 could be comprised of ten 40 $\mu$m × 40 $\mu$m segments to account for approximately 5 $\mu$m of bath related undercutting. Adjacent segments would be separated from each other by a thin wall 13 that self-destructs at some time, 75% to 95% (preferably 90%) into the etch. Typically, the width of each thin wall 13 should be between 8 and 10 $\mu$m, in this example, and preferably 9 $\mu$m so that the walls will self-destruct 90% into the etch. As shown above, when the <110> direction is misoriented by 0.2°, a 50 $\mu$m × 500 $\mu$m channel having its lengthwise axis perpendicular to the <110> direction will increase 1.57 $\mu$m in width. By segmenting the channel into 50 $\mu$m × 50 $\mu$m segments, the channel will increase in width, under the same conditions, by only 0.157 $\mu$m.

In an anisotropic etching process, a substrate, which can include silicon, is first covered with an etching mask. If the substrate is silicon, an etching mask such as $SiO_2$, $Si_3N_4$, or any of a variety of other etching masks well known in the art can be employed. Preferably, an $Si_3N_4$ layer can be formed on a silicon substrate in any of an assortment of well-known methods. The $Si_3N_4$ layer is then covered with photoresist. The photoresist is spin-coated onto the $Si_3N_4$ layer in a spinner. This photoresist layer is then exposed to electromagnetic radiation such as ultra-violet light through a mask. The mask will have segmented areas for the channel structure and a broader area for a reservoir. The photoresist layer is then developed in any of a collection of known methods, thus leaving a patterned photoresist layer on the $Si_3N_4$ layer. The exposed areas of the $Si_3N_4$ layer are then etched away in a reaction chamber by wet chemicals or preferably by dry plasma etching. The photoresist layer can then be removed, after which the entire substrate is exposed to a concentration of KOH or other of numerous orientation dependent etches in a reaction chamber for approximately three to four hours.

Figure 1:
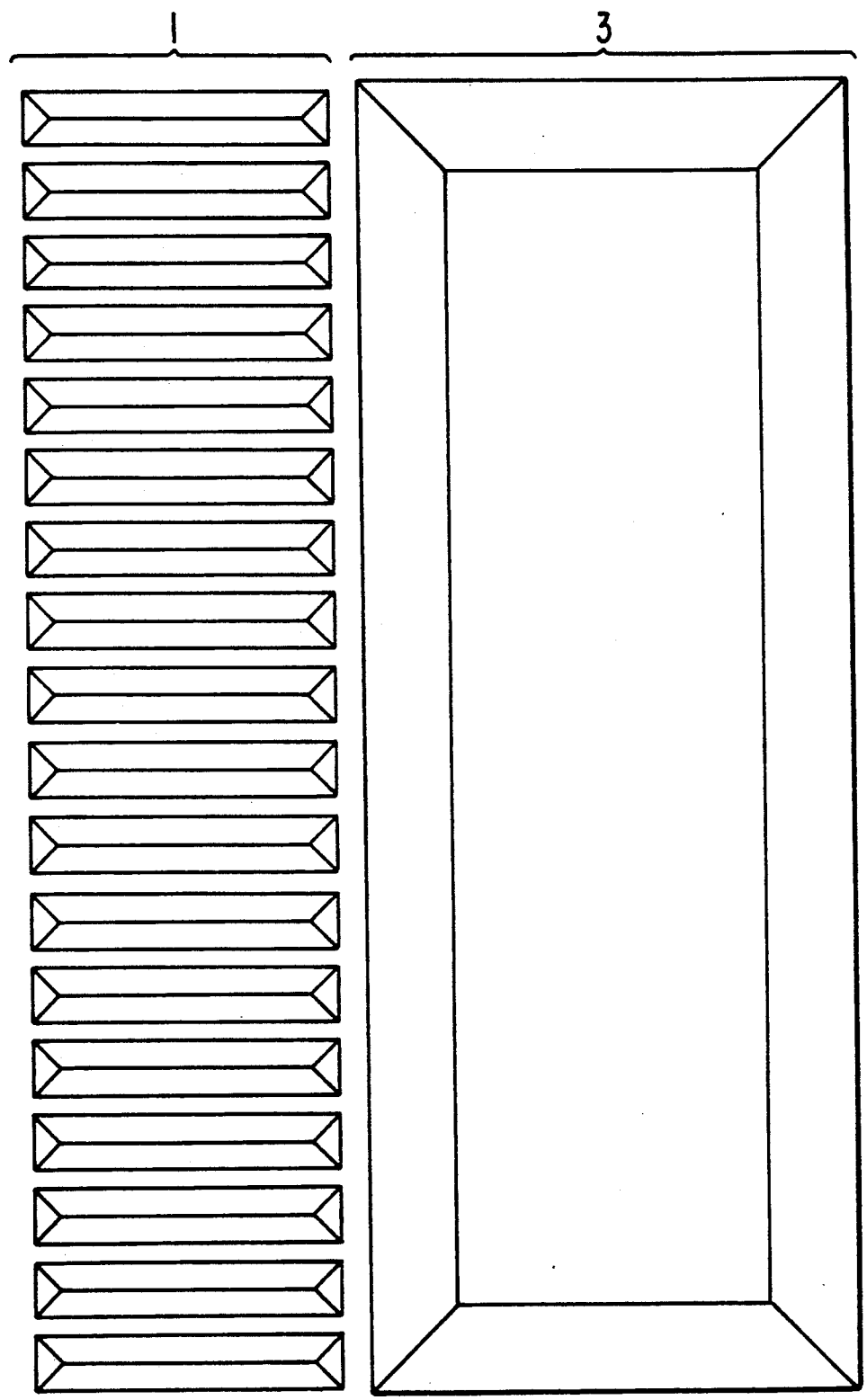
FIG. 1 is a schematic diagram of a single step channel plate design.
Figure 2:
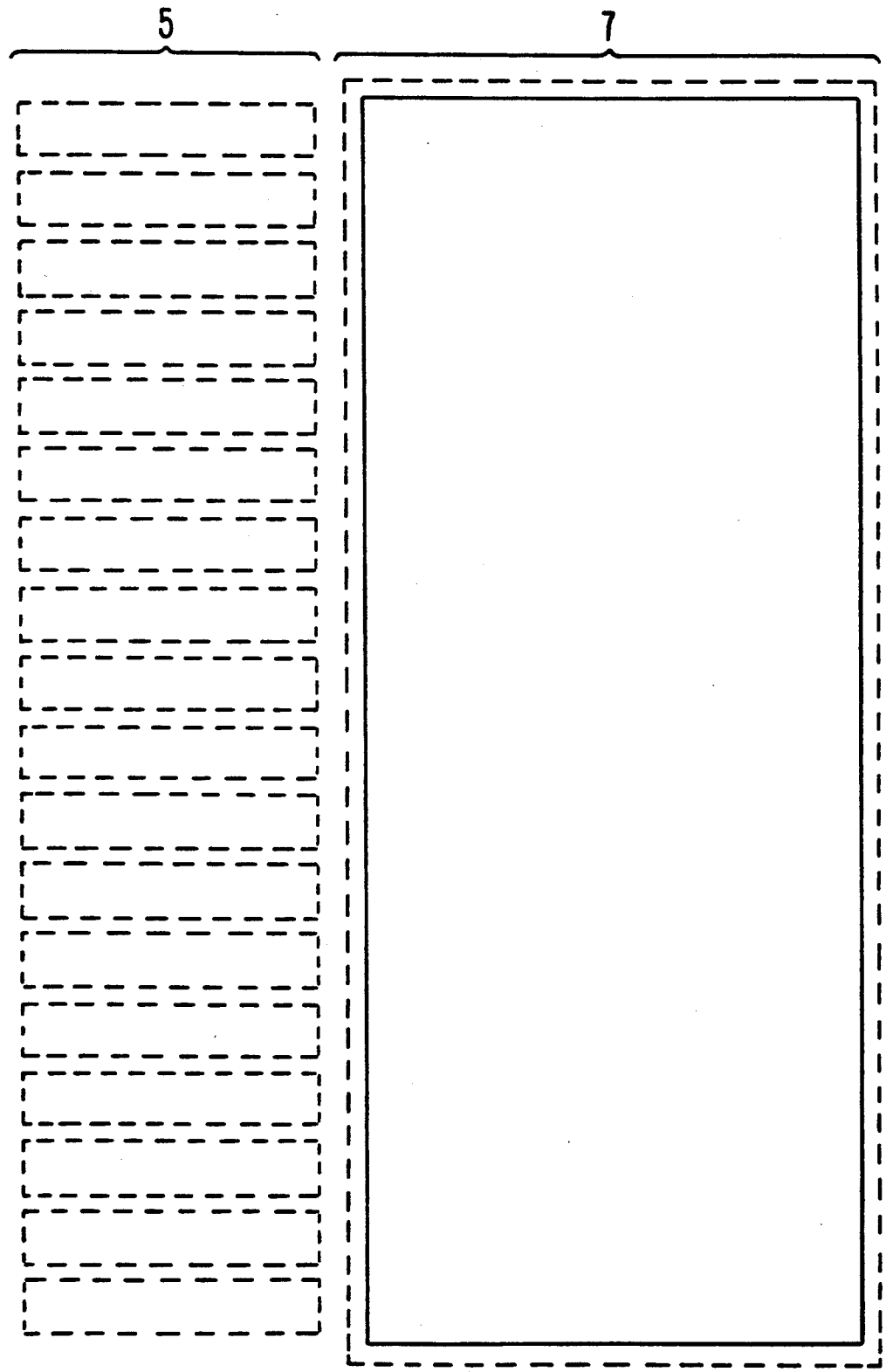
FIG. 2 is a schematic diagram of a two-step channel plate design.

As described before, the anisotropic etching rate of silicon depends, among other things, on the crystal lattice plane. An anisotropic etchant such as KOH will react with the {100} planes slower than the {110} planes and extremely faster than the {111} planes. Because of the slow etching rate of the {111} planes, these planes will remain intact and exposed after the etch is completed. This is referred to as termination. Referring back to FIG. 1, the exposed {111} planes connect in a V structure in the channels 1. During the etching of the larger etching area in the reservoir 3, successive {100} planes are etched away such that the {111} planes are exposed, but never connect because the substrate is etched completely through. More importantly, the reservoir 3 and channels 1 can be etched at the same time in a one-step etching process.

Referring to FIG. 3, a reservoir 15 is etched completely through the substrate. If the thickness of the walls 13 is 9 μm for the segmented channels, then these walls 13 should substantially merge after 90% of the etching step is completed and completely disappear by the time etching is terminated. As illustrated in FIG. 4b, the channels 9 will be relatively smooth with small undulations 14 at the thin wall 13 sites. Thicker walls will leave larger undulations in the channel, while thinner walls will self-destruct too early, which may cause the channel to achieve their widened, stable dimension. Wall structures that separate the channels are not etched away during this process because of the Si₃N₄ etching mask. FIG. 4a illustrates the loss of dimensional control resulting from misalignment of mask pattern 23 to the <110> direction, as defined in equation 1, above, for a non-segmented channel. The same misalignment of the mask 23 in a segmented channel produces smaller dimensional error, as shown in FIG. 4b.

Ink communication between the ink reservoir and the channel is achieved by means of a bypass pit structure formed in the heater die. As shown in FIG. 5, ink is passed from the reservoir 15 to channel 9 by way of bypass pit 17 fabricated in the pit layer 25 on a heater die 19 with a heater pit 21. The ink flow is indicated by arrow 27.

After removing the etching mask, this channel plate can be coupled with a heater die to form a thermal ink jet printer head. Numerous dies are fabricated on a wafer and are separated by dicing after mating a heater plate wafer and a channel plate wafer. Such a process is shown in Re. 32,572 to Hawkins et al. and will not be discussed in detail here. It should be kept in mind that the invention is not limited to the fabrication of printheads, but applies to all semiconductor processes requiring the precise placement of rectangular and large aspect ratio structures.

The above is a detailed description of a particular embodiment of the invention. The full scope of the invention is set out in the claims that follow and their equivalents. Accordingly, the claims and specification should not be construed to unduly narrow the full scope of protection to which the invention is entitled.

What is claimed is:

1. A method of fabricating rectangular and large aspect ratio features in a substrate amenable to anisotropic etching processes, comprising:
   forming a patterned etching mask on a planar surface of a substrate;
   said etching mask being delineated to expose segmented areas in said substrate, such that said plurality of segmented areas are separated by a plurality of wall structures in said etching mask; and
   anisotropically etching said exposed areas of said substrate for a period of time such that wall structures formed during said anisotropic etching step are substantially removed before said etching step is terminated.

2. The method of claim 1, wherein said substrate is formed from silicon.

3. The method of claim 2, wherein said planar surface of said substrate is the {100} planar surface.

4. The method of claim 2, wherein said planar surface of said substrate is the {110} planar surface.

5. The method of claim 1, wherein in said anisotropic etch step is in KOH and said period of time is approximately three hours.

6. The method of claim 1, wherein said segmented areas have dimensions of 50 μm × 50 μm.

7. The method of claim 6, wherein in said etching steps, said wall structures have a thickness of between 8 μm and 10 μm.

8. The method of claim 6, wherein in said etching steps, said wall structures undercut 75% to 95% through the etch sequence.

9. The method of claim 1, wherein in said forming step, said etching mask is formed from Si₃N₄.

10. The method of claim 1, wherein in said anisotropic etching step, said substrate is exposed to a concentration of KOH in a reaction chamber.

11. The method of claim 1 wherein in said anisotropic etching step wall structures formed during said anisotropic etching step are substantially removed after 90% of the period of time for said anisotropic etching step.

12. A method of fabricating channels and a reservoir in a substrate amenable to anisotropic etching processes for a thermal ink jet printhead, comprising:
   forming a patterned etching mask on a planar surface of a substrate;
   said etching mask being delineated to expose broad and segmented areas in said substrate, such that said plurality of segmented areas are separated by a plurality of wall structures in said etching mask; and
   anisotropically etching said exposed areas of said substrate for a period of time such that said exposed broad area is completely etched through said substrate and wall structures formed during said anisotropic etching step are substantially removed before said etching step is driven to completion.

13. The method of claim 12, wherein said substrate is formed from silicon.

14. The method of claim 13, wherein said planar surface of said substrate is the {100} planar surface.

15. The method of claim 13, wherein said planar surface of said substrate is the {planar} surface.

16. The method of claim 12, wherein in said anisotropic etch step, said period of time is approximately three hours.

17. The method of claim 12, wherein said segmented areas have dimensions of 50 μm × 50 μm.

18. The method of claim 17, wherein in said etching steps, said wall structures have a thickness of between 8 μm and 10 μm.

19. The method of claim 17, wherein in said etching steps, said wall structures have a thickness of approximately 9 μm.

20. The method of claim 12, wherein in said forming step, said etching mask is formed from Si₃N₄.

21. The method of claim 12, wherein in said anisotropic etching step, said substrate is exposed to a concentration of KOH in a reaction chamber.

22. The method of claim 12 wherein in said anisotropic etching step wall structures formed during said anisotropic etching step are substantially removed after 90% of the period of time for said anisotropic etching step.

23. A method of fabricating channels and a reservoir in a substrate amenable to etching processes for a thermal ink jet printhead, comprising:
   forming a patterned etching mask on a planar surface of a substrate;
   said etching mask being delineated to expose broad and segmented areas in said substrate, such that said plurality of segmented areas are separated by a plurality of wall structures in said etching mask;
removing said photoresist layer;
anisotropically etching said exposed areas of said substrate for a period of time such that said exposed broad area is completely etched through said substrate and wall structures formed during said anisotropic etching step are substantially removed before said etching step is driven to completion;
removing said etching mask; and
coupling said substrate to a heater die to form a thermal ink jet printhead.

* * * * *

UNITED STATES PATENT AND TRADEMARK OFFICE
CERTIFICATE OF CORRECTION

PATENT NO. : 5,096,535
DATED : March 17, 1992
INVENTOR(S) : William G. Hawkins, et. al.

It is certified that error appears in the above-indentified patent and that said Letters Patent is hereby corrected as shown below:

| Column | Line | |
|---|---|---|
| 1 | 45 | Change "plance" to --plane--. |
| 1 | 52 | Change "is" to --are--. |
| 3 | 15 | Before "areas" insert --some--. |
| 3 | 38 | Change "wafers" to --surface--. |
| 4 | 57 | Change "extremely" to --much--. |
| 5 | 66 | After "wherein" delete "in". |
| 5 | 67 | Change "etch" to --etching--. |
| 6 | 7 | After "structures" insert --are--. |
| 6 | 58 | After "step" insert --,--. |

Signed and Sealed this

Twenty-sixth Day of April, 1994

Attest:

BRUCE LEHMAN

*Attesting Officer*     *Commissioner of Patents and Trademarks*